United States Patent
Hong et al.

(10) Patent No.: US 8,530,988 B2
(45) Date of Patent: Sep. 10, 2013

(54) JUNCTION ISOLATION FOR MAGNETIC READ SENSOR

(75) Inventors: Liubo Hong, San Jose, CA (US); Guangli Liu, Pleasanton, CA (US)

(73) Assignee: HGST Netherlands B.V., Amsterdam (NL)

( * ) Notice: Subject to any disclaimer, the term of this patent is extended or adjusted under 35 U.S.C. 154(b) by 15 days.

(21) Appl. No.: 12/976,748

(22) Filed: Dec. 22, 2010

(65) Prior Publication Data

US 2012/0161264 A1    Jun. 28, 2012

(51) Int. Cl.
*H01L 29/82* (2006.01)

(52) U.S. Cl.
USPC .................................. 257/422; 257/E29.323

(58) Field of Classification Search
USPC .......................... 257/422, E29.323; 360/324
See application file for complete search history.

(56) References Cited

U.S. PATENT DOCUMENTS

| | | | |
|---|---|---|---|
| 6,754,053 B2 | 6/2004 | Yoshikawa et al. | |
| 6,759,081 B2 | 7/2004 | Huganen et al. | |
| 7,057,859 B2 | 6/2006 | Kagami et al. | |
| 7,075,121 B2 * | 7/2006 | Hibino ............................ 257/104 |
| 7,313,857 B2 | 1/2008 | Kanaya et al. | |
| 7,333,305 B2 | 2/2008 | Gill | |
| 7,352,539 B2 | 4/2008 | Sato et al. | |
| 7,440,242 B2 | 10/2008 | Pinarbasi | |
| 7,443,635 B2 | 10/2008 | Tanaka et al. | |
| 7,530,158 B2 | 5/2009 | Araki et al. | |
| 7,639,456 B2 | 12/2009 | Hong et al. | |
| 7,652,857 B2 | 1/2010 | Sato | |
| 2006/0279881 A1 * | 12/2006 | Sato ......................... 360/324.12 |
| 2009/0059443 A1 | 3/2009 | Tsuchiya et al. | |
| 2009/0067099 A1 | 3/2009 | Tsuchiya et al. | |
| 2009/0091863 A1 | 4/2009 | Hosotani et al. | |

FOREIGN PATENT DOCUMENTS

| | | |
|---|---|---|
| JP | 2006210794 A | 8/2006 |
| JP | 2008140521 A | 6/2008 |
| WO | 2008117435 A1 | 10/2008 |

* cited by examiner

*Primary Examiner* — Tran Tran
(74) *Attorney, Agent, or Firm* — Patterson & Sheridan, LLP

(57) ABSTRACT

Embodiments generally relate to a magnetic read sensor and a method for its manufacture. A multi-layer insulating material may be used to cover both the first shield layer and also the sidewalls of the sensor structure in the magnetic read sensor. The first insulating layer of the multi-layer insulating material may be deposited by an ion beam sputtering process in a chamber that does not have any oxygen gas flowing into it so that oxygen diffusion into the sensor structure is reduced or eliminated. Then, a second insulating layer of the multi-layer insulating material may be deposited by atomic layer deposition such that the second insulating layer has a greater quality than the first insulating layer. The higher quality increases the breakdown voltage for the magnetic read sensor. Thus, the magnetic read sensor of the present invention has an effective insulating portion that increases the breakdown voltage without sensor damage.

20 Claims, 2 Drawing Sheets

JUNCTION ISOLATION FOR MAGNETIC READ SENSOR

BACKGROUND OF THE INVENTION

1. Field of the Invention

Embodiments of the present invention generally relate to a magnetic read sensor and a method for its manufacture.

2. Description of the Related Art

Magnetic read sensors are used in hard disk drives to read bits of data from the hard disk drive. An example of a magnetic read sensor is shown in FIG. 1. The magnetic read sensor includes a first shield layer 102 and a sensor structure including a pinned layer 106, a barrier layer 108, a free layer 110 and a cap layer 112. The top of the first shield layer 102 and the sidewalls of the sensor structure are covered with an insulating layer 114. A hard bias layer 116 and a hard bias capping layer 118 are then formed over the insulating layer 114. A top lead layer 120 and second shield layer 104 are then formed over the hard bias capping layer 118, hard bias layer 116, insulating layer 114 and cap layer 112.

The insulating layer 114 may comprise aluminum oxide and is used to electrically separate first shield layer 102 from the second shield layer 104 in areas away from the sensor junction. The sensor junction is the area where the insulating layer 114 separates the sensor structure from the adjacent hard bias layer 116 that magnetically biases and stabilizes the sensor structure.

The insulating layer 114 typically is deposited by an atomic layer deposition (ALD) process. However, ALD has certain drawbacks. One of the drawbacks is sensor structure edge damage. Because ALD involves introducing an oxidizing gas such as water vapor or oxygen into the chamber during the deposition process, portions of the sensor, such as the barrier layer 108 and pinned layer 106, oxidize when exposed to the oxidizer. Thus, the edges or sidewalls of the sensor structure are damaged due to oxidation. Another drawback is the oxygen from the ALD process diffuses into the barrier layer 108, which increases the RA value (i.e., resistance times area).

SUMMARY OF THE INVENTION

The present invention generally relates to a magnetic read sensor and a method for its manufacture. A multi-layer insulating material may be used to cover both the first shield layer and also the sidewalls of the sensor structure in the magnetic read sensor. The first insulating layer of the multi-layer insulating material may be deposited by an ion beam sputtering process in an atmosphere that does not have any oxygen gas so that oxygen diffusion into the sensor structure is reduced or eliminated. Then, a second insulating layer of the multi-layer insulating material may be deposited by atomic layer deposition such that the second insulating layer has a greater quality than the first insulating layer. The higher quality increases the breakdown voltage for the magnetic read sensor. Thus, the magnetic read sensor of the present invention has an effective insulating portion that increases the breakdown voltage without sensor damage.

In one embodiment, a method of manufacturing a magnetic read sensor is disclosed. The method includes forming a sensor structure over a first shield layer, the sensor structure having sidewalls and a top surface and depositing a multi-layer insulating material over the first shield layer, the sidewalls of the sensor structure and the top surface of the sensor structure. The multi-layer insulating material depositing method includes physical vapor depositing a first insulating layer over the first shield layer to a first thickness, the sidewalls of the sensor structure to a second thickness, and the top surface of the sensor structure to a third thickness, and conformally depositing a second insulating layer over the first insulating layer such that the second insulating layer has a substantially uniform thickness. The magnetic read sensor manufacturing method also includes removing portions of the second insulating layer and the first insulating layer to expose the top surface of the sensor structure, forming a hard bias layer and a hard bias capping layer over the second insulating layer, and forming a second shield layer over the hard bias capping layer and the top surface of the sensor structure.

In another embodiment, a method of manufacturing a magnetic read sensor is disclosed. The method includes forming a sensor structure over a first shield layer. The sensor structure has sidewalls and a top surface and depositing a first insulating layer by an ion beam sputtering process over the first shield layer to a first thickness, the sidewalls of the sensor structure to a second thickness, and the top surface of the sensor structure to a third thickness. The ion beam sputtering includes sputtering a target to form an insulating material in an environment consisting essentially of no oxygen gas. The method also includes depositing a second insulating layer by an atomic layer depositing process over the first insulating layer, etching the second insulating layer and the first insulating layer to expose the top surface of the sensor structure, and forming a hard bias layer and a hard bias capping layer over the second insulating layer. The method additionally includes forming a second shield layer over the hard bias capping layer and the top surface of the sensor structure.

In another embodiment, a magnetic read head is disclosed. The magnetic read head includes a first shield layer, a sensor structure formed over the first shield layer and having a top surface and sidewalls, and a first insulating layer formed over the first shield layer to a first thickness and the sidewalls of the sensor structure to a second thickness. The magnetic read head also includes a second insulating layer formed over the first insulating layer, the second insulating layer having a third thickness, a hard bias layer formed over the second insulating layer, a hard bias capping layer formed over the hard bias layer, and a second shield layer formed over the hard bias capping layer and the top surface of the sensor structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present invention generally relates to a magnetic read sensor and a method for its manufacture. A multi-layer insulating material may be used to cover both the first shield layer and also the sidewalls of the sensor structure in the magnetic read sensor. The first insulating layer of the multi-layer insulating material may be deposited by an ion beam sputtering process in an atmosphere that does not have any oxygen gas flowing into the chamber so that oxygen diffusion into the sensor structure is reduced or eliminated. Then, a second insulating layer of the multi-layer insulating material may be deposited by atomic layer deposition such that the second insulating layer has a greater quality than the first insulating layer. The higher quality increases the breakdown voltage for the magnetic read sensor. Thus, the magnetic read sensor of the present invention has an effective insulating portion that increases the breakdown voltage without sensor damage.

Figure 1:
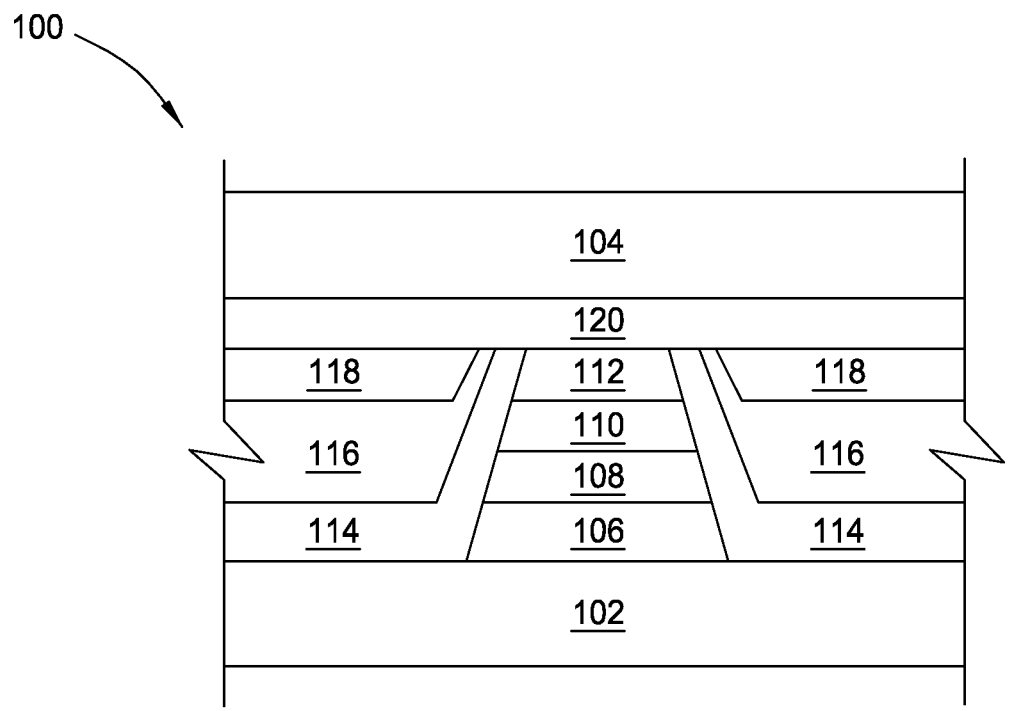
FIG. 1 is a schematic cross sectional view of a prior art magnetic read sensor.
Figure 2A:
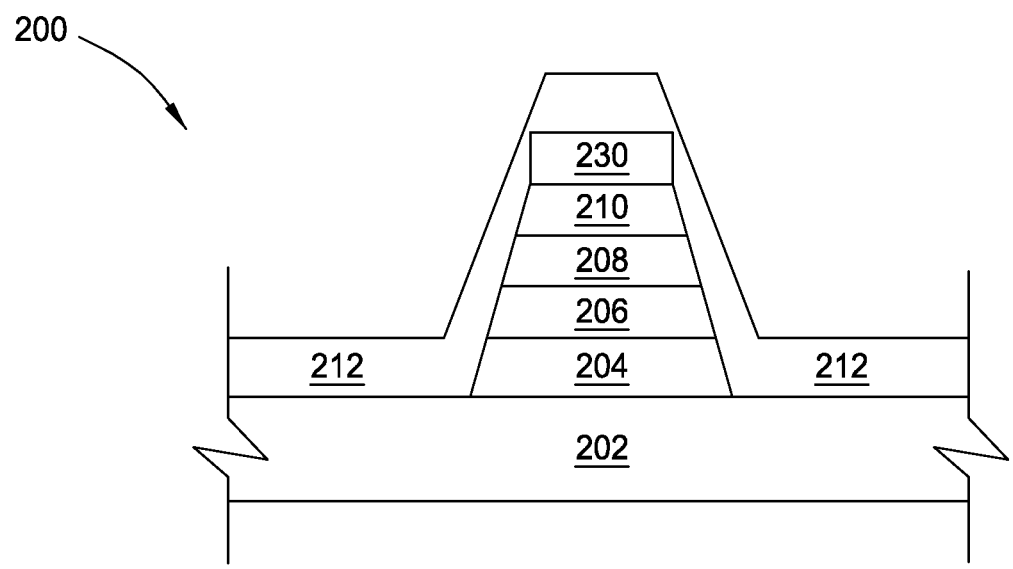
FIGS. 2A-2C are schematic cross sectional views of a magnetic read sensor at various stages of production according to one embodiment of the invention.
Figure 2B:
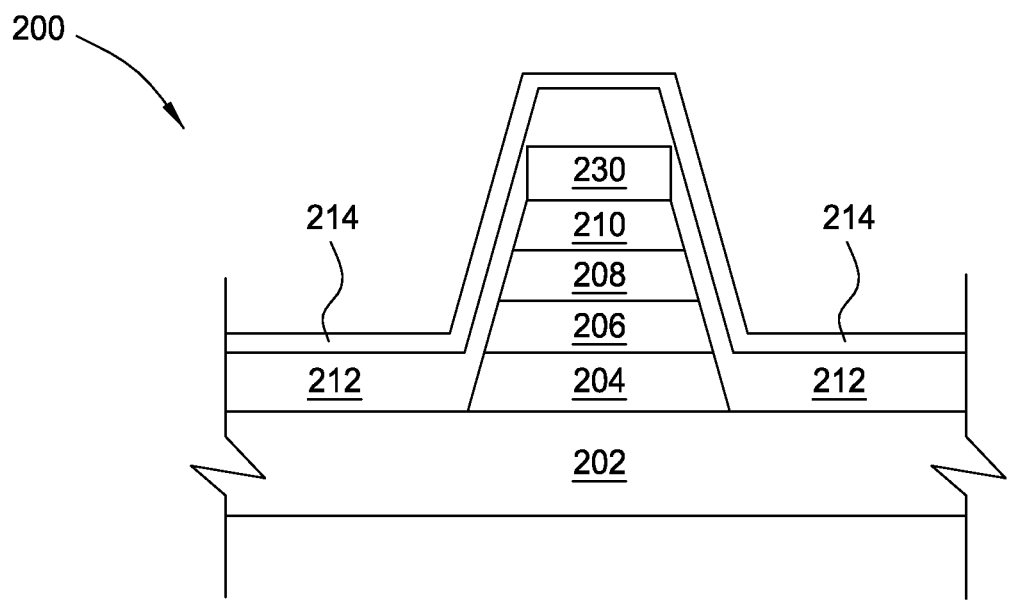
Figure 2C:
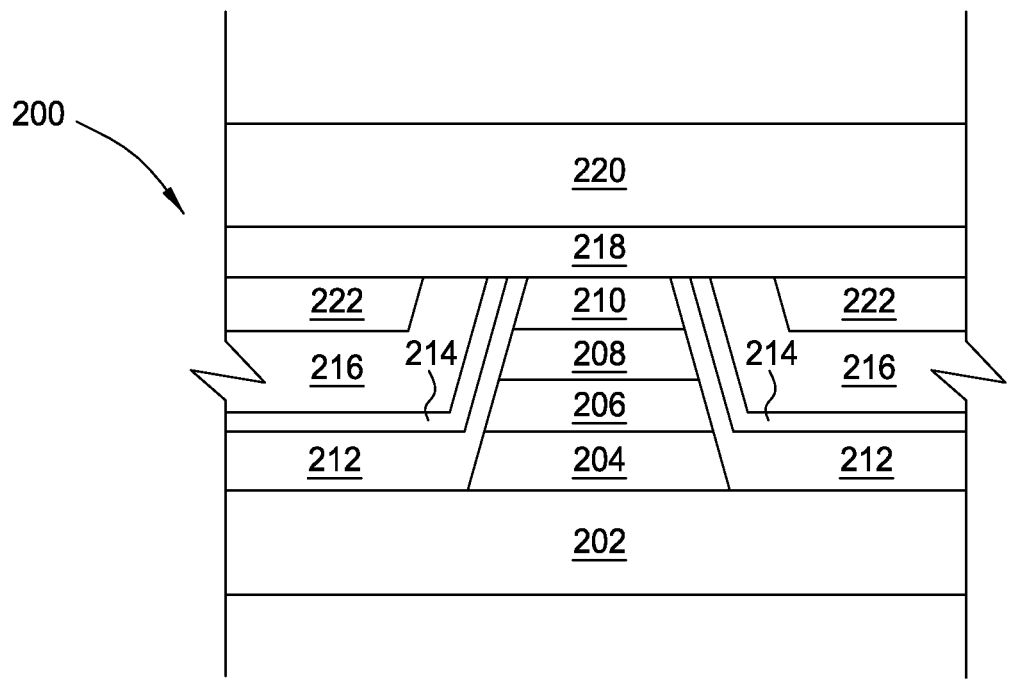

FIGS. 2A-2C are schematic cross sectional views of a magnetic read sensor 200 at various stages of production according to one embodiment of the invention. The magnetic read sensor 200 includes a first shield layer 202. The first shield layer 202 may comprise a ferromagnetic material. Suitable ferromagnetic materials that may be utilized include Ni, Fe, Co, NiFe, NiFeCo, NiCo, CoFe and combinations thereof.

Over the first shield layer 202, the sensor stack may be deposited. The sensor stack includes the pinned layer 204, barrier layer 206, free layer 208 and cap layer 210. The pinned layer 204 may be one of several types of pinned layers, such as a simple pinned, antiparallel pinned, self pinned or antiferromagnetic pinned. For purposes of simplicity, the sensor will be described herein as an antiparallel pinned, antiferromagnetic pinned sensor having a first antiparallel layer, a second antiparallel layer, and a non-magnetic, antiparallel coupling layer, such as Ru sandwiched therebetween. The first and second antiparallel layers can be constructed of several magnetic materials such as, for example NiFe or CoFe, and have magnetic moments that are pinned by exchange coupling of the first antiparallel layer with a layer of antiferromagnetic layer. The antiferromagnetic layer may include materials such as IrMn or PtMn. The barrier layer 206 may comprise an insulating material such as alumina or magnesium oxide. The free layer 208 may comprise ferromagnetic material such as Co, CoFe, NiFe or combinations thereof. The cap layer 210 may comprise a material to protect the sensor from damage such as tantalum and Ru.

The sensor stack may be formed by forming a photoresist mask 230 over the material for the cap layer 210 and then removing material from the layers that form the pinned layer 204, barrier layer 206, free layer 208 and cap layer 210. The photoresist mask 230 is formed by depositing a photoresist layer and then exposing and developing the photoresist layer to form the mask 230. The material may be removed to form the sensor stack by performing an ion beam etching process.

Once the sensor structure is fabricated, a portion of the first shield layer 202 is exposed. A first insulating layer 212 is deposited over the exposed first shield layer 202 as well as over the sensor stack as shown in FIG. 2A such that the first insulating layer 212 is formed over the sidewalls of the sensor stack and the top of the photoresist mask 230. While discussion for the insulating layer will refer to aluminum oxide, it is to be understood that other insulating materials may be utilized as well. The first insulating layer 212 may be deposited by a physical vapor deposition process such as ion beam sputtering or RF sputtering. During an ion beam sputtering process, an insulating target, such as aluminum oxide is sputtered in an atmosphere consisting essentially of an inert gas, such as argon. During an RF sputtering process, an RF bias is applied to an insulating sputtering target in an atmosphere consisting essentially of an inert gas, such as argon.

During normal ion beam sputtering of an oxide target material, an oxidizing assisting gas would typically be provided in order to ensure that sputtered material deposits with the same stoichiometry as the target. A typical oxidizing assisting gas that is used is oxygen. During sputtering, the target compound may suffer a reduction such that the deposited material is not stoichiometric and thus, not identical to the sputtering target material. Therefore, typically the oxidizing gas is provided along with the inert gas.

The oxidizing gas presents a problem. The oxidizing gas not only operates to oxidize the sputtering material, but may also cause sensor structure damage by oxidizing the edge of the sensor structure. In the embodiments discussed herein, an oxidizing gas is purposefully not introduced to the sputtering chamber during the first insulating layer 212 deposition. Thus, the first insulating layer 212 may not be stoichiometric. In either the ion beam sputtering process or the RF sputtering process, the insulating sputtering target is simply sputtered in an atmosphere consisting essentially of an inert gas without any oxygen gas flowing into the deposition chamber. Of course, should the insulating material be nitrogen based, the insulating material is sputtered in an atmosphere consisting of nitrogen gas without any oxygen gas.

Physical vapor deposition is a directional deposition process. Thus, during the deposition, more material will deposit onto the surfaces that directly face the sputtering target as compared to surfaces that are close to or perpendicular to the face of the sputtering target. As shown in FIG. 2A, more material has deposited onto the exposed first shield layer 202 and on the top surface of the mask 230 rather than the edges of the sensor structure. Therefore, the thickness of the first insulating layer 212 on the first shield layer 202 is greater than the thickness of the first insulating layer 212 on the sensor structure (not including the top of the mask 230). The thickness of the first insulating layer 212 over the first shield layer 202 may be between about 1 nm and about 3 nm. The thickness of the first insulating layer 212 over the edges of the sensor structure may be between about 0.5 nm and about 1 nm.

The difference in thicknesses over the first shield layer 202 and the edges of the sensor structure is beneficial. It is desirable to have as small a separation between the hard bias layer 216 and the sensor structure as possible in order to get a stronger stabilization field to the sensor from the hard bias layer 216. The separation is largely controlled by the insulating material deposited over the sensor structure, especially next to the free layer 208. Having a thinner insulating material between the hard bias layer 216 and the free layer 208 is preferred because it has been found that the closer the hard bias layer 216 is to the free layer 208, the more effective the magnetic stabilization will be.

It is also desirable to have a large electrical insulating thickness between the second shield layer 220 and the first shield layer 202 in order to minimize the risk of electrical shorting and increase the production yield. On the first shield layer 202, a thicker insulating material is more beneficial because there is better electrical isolation and less of an impact from pin hole particle defects the further that the first shield layer 202 and the second shield layer 220 are spaced apart.

In an ALD process, the thickness along the first shield layer 212 and the edges of the sensor structure would be identical due to the conformal nature of ALD. Therefore, ALD cannot meet the conflicting desires discussed above. Physical vapor deposition, while giving a thinner insulating layer along the edges of the sensor structure and a thicker insulating material over the first shield layer 202, but the electrical insulating properties of a physical vapor deposited insulating layer is not as good as an ALD insulating material. Thus, a second insulating layer 214 may be used in conjunction with the first insulating layer 212.

Once the first insulating layer 212 is deposited, a second insulating layer 214 may be deposited thereover to form a bi-layer insulating material. The second insulating layer 214 may comprise an insulating material such as aluminum oxide. Unlike the first insulating layer 212, the second insulating layer 214 may be stoichiometric. It is to be understood that while aluminum oxide is described as the insulating material for the second insulating layer 214, other insulating materials are also contemplated. The second insulating layer 214 may be deposited by an ALD process. During the ALD process, a metal precursor, such as an aluminum precursor, is delivered to the processing chamber along with an oxidizing precursor, such as water vapor or oxygen. The precursors react and deposit the insulating material. Of course, should the insulating material be nitrogen based, a nitrogen precursor would be utilized instead of the oxygen precursor. Similarly, should an oxynitride insulating material be desired, both an oxygen precursor and a nitrogen precursor would be utilized.

While ALD may normally result in damage to the sensor structure or oxygen diffusion into the sensor structure as discussed above, the first insulating layer 212 acts as a barrier to prevent oxygen diffusion to the sensor structure. Because the oxygen does not diffuse into the sensor structure, the RA value does not increase as much as compared to a device utilizing a single layer ALD insulating material. Thus, the second insulating layer 214, even though deposited by ALD, does not damage the sensor structure.

The second insulating layer 214, because it is deposited by ALD, has a better film quality than the first insulating layer 212. The ALD results in a denser layer (due to the conformal deposition) having a higher breakdown voltage. Thus, the multi-layer insulating material has a better insulating property than a single, physical vapor deposited insulating layer that has the same thickness. The second insulating layer 214 may be deposited to a thickness of between about 1 nm and about 3 nm over the entire first insulating layer 212.

After the second insulating layer 214 is deposited, the hard bias layer 216 and hard bias capping layer 222 may be deposited. Portions of the hard bias capping layer 222, hard bias layer 216, second insulating layer 214 and first insulating layer 212 may be removed by a process such as chemical mechanical polishing, reactive ion etching, sputter etching, or ion milling to expose the cap layer 210. The hard bias layer may comprise a material having a high magnetic moment such as CoPt. The hard bias capping layer 222 may comprise a material to protect the hard bias layer 216 from damage such as tantalum. It is to be understood that the hard bias layer 216 may comprise multiple layers, including one or more seed layers. The mask 230 and any material deposited thereover may be removed and the resulting surface planarized to permit depositing of further layers thereover.

A top lead layer 218 and second shield layer 220 may then be deposited. The top lead layer 218 may comprise tantalum, copper, gold, rhodium, aluminum and combinations thereof. The second shield layer 220 may comprise a ferromagnetic material. Suitable ferromagnetic materials that may be utilized include Ni, Fe, Co, NiFe, NiFeCo, NiCo, CoFe and combinations thereof.

The combination of the first insulating layer 212 deposited by a physical vapor deposition or ion beam deposition process along with the second insulating layer 214 deposited by ALD, provides better insulating properties as compared to a single insulating layer of the same thickness deposited by physical vapor deposition. The combination of the first insulating layer 212 deposited by a physical vapor deposition or ion beam deposition process along with the second insulating layer 214 deposited by ALD, provides a better device that does not have sensor structure damage at the edge of the sensor as compared to a single insulating layer of the same thickness deposited by ALD. The entire multi-layer insulating material structure has a lower RA as compared to a single insulating layer.

While the foregoing is directed to embodiments of the present invention, other and further embodiments of the invention may be devised without departing from the basic scope thereof, and the scope thereof is determined by the claims that follow.

What is claimed is:

1. A magnetic read head, comprising:
 a first shield layer;
 a sensor structure formed over the first shield layer and having a top surface and sidewalls;
 a first insulating layer formed over the first shield layer to a first thickness and the sidewalls of the sensor structure to a second thickness, wherein the first thickness is greater than the second thickness;
 a second insulating layer formed over the first insulating layer, the second insulating layer having a third thickness over the entire first insulating layer;
 a hard bias layer formed over the second insulating layer;
 a hard bias capping layer formed over the hard bias layer;
 a top lead layer formed over and directly contacting the hard bias capping layer, the top surface of the sensor structure, the first insulating layer, and the second insulating layer; and
 a second shield layer formed over the top lead layer.

2. The magnetic read head of claim 1, wherein the first insulating layer is not stoichiometric.

3. The magnetic read head of claim 2, wherein the first insulating layer and the second insulating layer are aluminum oxide.

4. The magnetic read head of claim 1, wherein a collective thickness of the first insulating layer and the second insulating layer over the first shield layer is greater than a collective thickness of the first insulating layer and the second insulating layer over the sidewalls of the sensor structure.

5. The magnetic read head of claim 4, wherein the first insulating layer is not stoichiometric.

6. The magnetic read head of claim 5, wherein the first insulating layer and the second insulating layer are aluminum oxide.

7. A magnetic read head, comprising:
 a first shield layer;

a sensor structure formed over the first shield layer and having a top surface and sidewalls;

a non-stoichiometric aluminum oxide layer formed over the first shield layer to a first thickness and the sidewalls of the sensor structure to a second thickness;

a stoichiometric insulating layer formed over the non-stoichiometric aluminum oxide layer, the stoichiometric insulating layer having a third thickness over the entire non-stoichiometric aluminum oxide layer;

a hard bias layer formed over the stoichiometric insulating layer;

a hard bias capping layer formed over the hard bias layer;

a top lead layer formed over and directly contacting the hard bias capping layer, the top surface of the sensor structure, the non-stoichiometric aluminum oxide layer, and the stoichiometric insulating layer; and a second shield layer formed over the top lead layer.

8. The magnetic read head of claim 7, wherein the stoichiometric insulating layer comprises aluminum oxide.

9. The magnetic read head of claim 8, wherein the first thickness is greater than the second thickness.

10. The magnetic read head of claim 7, wherein a collective thickness of the non-stoichiometric aluminum oxide layer and the stoichiometric insulating layer over the first shield layer is greater than a collective thickness of the non-stoichiometric aluminum oxide layer and the stoichiometric insulating layer over the sidewalls of the sensor structure.

11. The magnetic read head of claim 10, wherein the stoichiometric insulating layer comprises aluminum oxide.

12. A magnetic read head, comprising:

a first shield layer;

a sensor structure formed over the first shield layer and having a top surface and sidewalls;

a first insulating layer formed over the first shield layer by a physical vapor deposition process, wherein the first insulating layer formed over the first shield layer has a first thickness and the sidewalls of the sensor structure has a second thickness;

a second insulating layer formed over the first insulating layer by a conformal deposition process;

a hard bias layer formed over the second insulating layer;

a hard bias capping layer formed over the hard bias layer;

a top lead layer formed over and directly contacting the hard bias capping layer, the top surface of the sensor structure, the first insulating layer, and the second insulating layer; and a second shield layer formed over the top lead layer.

13. The magnetic read head of claim 12, wherein the first insulating layer is not stoichiometric.

14. The magnetic read head of claim 13, wherein the first insulating layer and the second insulating layer are aluminum oxide.

15. The magnetic read head of claim 14, wherein the first thickness is greater than the second thickness.

16. The magnetic read head of claim 12, wherein a collective thickness of the first insulating layer and the second insulating layer over the first shield layer is greater than a collective thickness of the first insulating layer and the second insulating layer over the sidewalls of the sensor structure.

17. The magnetic read head of claim 16, wherein the first insulating layer is not stoichiometric.

18. The magnetic read head of claim 17, wherein the first insulating layer and the second insulating layer are aluminum oxide.

19. The magnetic read head of claim 18, wherein the hard bias layer comprises CoPt.

20. The magnetic read head of claim 19, wherein the second shield layer comprises a ferromagnetic material.

* * * * *